United States Patent
Das et al.

(10) Patent No.: US 10,303,648 B1
(45) Date of Patent: May 28, 2019

(54) LOGICAL AND PHYSICAL OPTIMIZATIONS FOR PARTIAL RECONFIGURATION DESIGN FLOW

(71) Applicant: Xilinx, Inc., San Jose, CA (US)

(72) Inventors: Sabyasachi Das, San Jose, CA (US); Zhiyong Wang, Cupertino, CA (US); Niyati Shah, San Jose, CA (US)

(73) Assignee: XILINX, INC., San Jose, CA (US)

( * ) Notice: Subject to any disclaimer, the term of this patent is extended or adjusted under 35 U.S.C. 154(b) by 9 days.

(21) Appl. No.: 15/600,534

(22) Filed: May 19, 2017

(51) Int. Cl.
| | |
|---|---|
| *G06F 17/50* | (2006.01) |
| *G06F 17/00* | (2019.01) |
| *G06F 15/00* | (2006.01) |
| *G06F 9/30* | (2018.01) |
| *G06F 15/78* | (2006.01) |
| *G06F 9/38* | (2018.01) |
| *G06F 15/80* | (2006.01) |
| *G06F 15/76* | (2006.01) |

(52) U.S. Cl.
CPC ........ *G06F 15/7867* (2013.01); *G06F 9/3885* (2013.01); *G06F 9/3897* (2013.01); *G06F 15/8007* (2013.01); *G06F 15/76* (2013.01); *G06F 15/80* (2013.01); *G06F 17/505* (2013.01); *G06F 2015/761* (2013.01)

(58) Field of Classification Search
CPC ............. G06F 15/8007; G06F 15/7867; G06F 17/5054; G06F 9/3885; G06F 9/3897; G06F 17/505
USPC .................................................. 716/116–117
See application file for complete search history.

(56) References Cited

U.S. PATENT DOCUMENTS

| | | | |
|---|---|---|---|
| 6,526,557 B1 | 2/2003 | Young et al. | |
| 6,907,595 B2 | 6/2005 | Curd et al. | |
| 7,482,836 B2 | 1/2009 | Levi et al. | |
| 7,518,396 B1 | 4/2009 | Kondapalli et al. | |
| 7,546,572 B1 | 6/2009 | Ballagh et al. | |
| 7,619,442 B1 | 11/2009 | Mason et al. | |
| 7,640,527 B1 | 12/2009 | Dorairaj et al. | |
| 7,941,777 B1* | 5/2011 | Young | G06F 17/5054 716/104 |
| 8,359,448 B1 | 1/2013 | Neuendorffer | |
| 8,415,974 B1 | 4/2013 | Lysaght | |
| 8,554,972 B2* | 10/2013 | Koch | G06F 15/7867 710/100 |
| 8,719,750 B1 | 5/2014 | Balzli, Jr. | |

(Continued)

OTHER PUBLICATIONS

Xilinx, "Partial Reconfiguration in the ISE Design Suite," [online], Xilinx, Inc., © 2017 [retrieved Apr. 5, 2017], retrieved from the Internet: http://www.xilinx.com/tools/partial-reconfiguration.htm>, 2 pp., Xilinx, Inc., San Jose, California, USA.

(Continued)

*Primary Examiner* — Stacy Whitmore
(74) *Attorney, Agent, or Firm* — Kevin T. Cuenot

(57) ABSTRACT

Implementing a partial reconfiguration design flow can include determining an interface net connecting static circuitry and a first reconfigurable module of a circuit design, performing, using a processor, a logical optimization on first circuitry of the static circuitry that is entirely external to the first reconfigurable module and on second circuitry entirely within the reconfigurable module, and excluding the interface net from processing using the logical optimization.

20 Claims, 5 Drawing Sheets

(56) References Cited

U.S. PATENT DOCUMENTS

| | | | |
|---|---|---|---|
| 8,751,998 B2* | 6/2014 | Mendel | G06F 17/5054 716/110 |
| 8,984,462 B1 | 3/2015 | Das et al. | |
| 9,235,660 B1 | 1/2016 | Lu et al. | |
| 9,483,597 B1 | 11/2016 | Das et al. | |
| 2006/0095879 A1* | 5/2006 | Brahme | G06F 17/505 716/113 |

OTHER PUBLICATIONS

Altera, "Quartus II Incremental Compilation for Hierarchical and Team-Based Design," Quartus II Handbook QII5V1, May 4, 2015, pp. 3-1 through 3-61, vol. 1, Chapter 3, Altera Corp., now Intel Corp., Santa Clara, California, USA.

Altera, "Design Planning for Partial Reconfiguration," Quartus II Handbook QII5V1, May 4, 2015, pp. 4-1 to 4-44, vol. 1, Chapter 4, Altera Corp., now Intel Corp., Santa Clara, California, USA.

Altera, "Timing Closure and Optimization," Quartus II Handbook Version 13.1 QII52005-13.1.0, Nov. 2013, pp. 12-1 to 12-46, vol. 2, Altera Corp., now Intel Corp., Santa Clara, California, USA.

Bourgeault, Mark, "Altera's Partial Reconfiguration Flow," [online] Altera Corporation © 2011, Jun. 23, 2011, retrieved from the Internet: <http://www.eecg.utoronto.ca/~jayar/FPGAseminar/FPGA_Bourgeault_June23_2011.pdf>, 41 pp.

Synopsys, "Synplify Premier, The Ultimate FPGA Implementation Plaltform," Synopsys Inc. © 2011, Synplify Premier Brochure, retrieved from the Internet: <http://web.archive.org/web/20120604091658/http://www.synopsys.com/Tools/Implementation/FPGAImplementation/Documents/synpremier-brochure.pdf>, 4 pp.

Pittman, Richard Neil, "Partial Reconfiguration: A Simple Tutorial," [online] Microsoft Research, Technical report MSR-TR 2012-19, Feb. 2012, retrieved from the Internet: <https://www.microsoft.com/en-us/research/wp-content/uploads/2016/02/prtutorial_1.pdf>, 69 pp.

Xilinx, "Partial Reconfiguration Tutorial, PlanAhead Design Tool," UG743 (v.14.1), May 8, 2012, pp. 1-42, Xilinx, Inc., San Jose, California, USA.

Athalye, Akshay et al., "Mapping of Partial Reconfigurable Data Flows to Xilinx FPGAs," Proc. of them IEEE SOC Conference, Sep. 25, 2005, pp. 111-112, IEEE, Piscataway, New Jersey, USA.

Mishra, Ashish et al., "Scheduling of Dataflow Graphs on Partial Reconfigurable Hardware in Xilinx PR Flow," Proc. of the IEEE Int'l. Conf. on Advanced Electronic Systems (ICAES), Sep. 21, 2013, pp. 108-112, IEEE, Piscataway, New Jersey, USA.

Frangieh, T. et al. "PATIS: Using Partial Configuration to Improve Static FPGA Design Productivity," Proc. of the 2010 IEEE International Symposium on Parallel & Distributed Processing, Apr. 19, 2010, pp. 1-8, IEEE, Piscataway, New Jersey, USA.

Altera, "Netlist Optimization and Physical Synthesis," Quartus II Handbook Version 13.1 QII52007-13.1.0, Nov. 2013, pp. 16-1 to 16-16, vol. 2, Altera Corp., now Intel Corp., Santa Clara, California, USA.

Altera, "Simultaneous Switching Noise (SSN) Analysis and Optimizations," Quartus II Version QII5V2, May 4, 2015, p. 3-1 through 3-19, Altera Corp., now Intel Corp., Santa Clara, California, USA.

Altera, "Timing Closure and Optimization," Quartus II Handbook Version QII5V2, Dec. 15, 2014, p. 12-1 to 12-42, vol. 2, Altera Corp., now Intel Corp., Santa Clara, California, USA.

Altera, "Power Optimization," Quartus II Handbook Version QII5V2, May 4, 2015, p. 13-1 to 13-19, Altera Corp., now Intel Corp., Santa Clara, California, USA.

* cited by examiner

LOGICAL AND PHYSICAL OPTIMIZATIONS FOR PARTIAL RECONFIGURATION DESIGN FLOW

TECHNICAL FIELD

This disclosure relates to integrated circuits (ICs) and, more particularly, to performing logical and physical optimizations in a partial reconfiguration design flow for an IC.

BACKGROUND

Partial reconfiguration refers to the dynamic modification of a subset of programmable circuitry of an integrated circuit (IC) while other programmable circuitry of the IC that is not part of the subset continues to operate uninterrupted. The portion of the circuit design for an IC that specifies the dynamically modifiable circuitry is generally referred to as a reconfigurable module. One or more reconfigurable modules may be instantiated, e.g., implemented, in an IC forming a reconfigurable partition on the device.

Partial reconfiguration is performed by loading a partial bitstream into the IC during operation. Multiple partial bitstreams may be created where each corresponds to different reconfigurable module(s) of the circuit design. Loading a new and/or different partial bitstream modifies or entirely changes the circuitry implemented in the reconfigurable partition. The circuitry outside of the reconfigurable partition that is not part of a reconfigurable module is referred to as "static circuitry." The static circuitry is unchanged from the loading of the partial bitstream. As such, while both the static circuitry and the circuitry in the reconfigurable partition may be formed of programmable circuitry, the static circuitry continues to operate uninterrupted as the circuitry within the reconfigurable partition is dynamically modified to implement different functions over time by loading different ones of the partial bitstreams.

SUMMARY

One or more embodiments are directed to methods for implementing a partial reconfiguration design flow. In one aspect, a method can include determining an interface net connecting static circuitry and a first reconfigurable module of a circuit design, performing, using a processor, a logical optimization on first circuitry of the static circuitry that is entirely external to the first reconfigurable module and on second circuitry entirely within the reconfigurable module, and excluding the interface net from processing using the logical optimization.

One or more embodiments are directed to systems for implementing a partial reconfiguration design flow. In one aspect, a system includes a memory configured to store program code and a processor coupled to the memory, wherein the processor, in response to executing the program code, is configured to initiate operations for a partial reconfiguration design flow. The operations include determining an interface net connecting static circuitry and a first reconfigurable module of a circuit design, performing a logical optimization on first circuitry of the static circuitry that is entirely external to the first reconfigurable module and on second circuitry entirely within the reconfigurable module, and excluding the interface net from processing using the logical optimization.

One or more embodiments are directed to computer program products for implementing a partial reconfiguration design flow. In one aspect, a computer program product includes a computer readable storage medium having program code stored thereon. The program code is executable by a processor to perform operations including determining an interface net connecting static circuitry and a first reconfigurable module of a circuit design, performing a logical optimization on first circuitry of the static circuitry that is entirely external to the first reconfigurable module and on second circuitry entirely within the reconfigurable module, and excluding the interface net from processing using the logical optimization.

This Summary section is provided merely to introduce certain concepts and not to identify any key or essential features of the claimed subject matter. Other features of the inventive arrangements will be apparent from the accompanying drawings and from the following detailed description.

BRIEF DESCRIPTION OF THE DRAWINGS

The inventive arrangements are illustrated by way of example in the accompanying drawings. The drawings, however, should not be construed to be limiting of the inventive arrangements to only the particular implementations shown. Various aspects and advantages will become apparent upon review of the following detailed description and upon reference to the drawings.

FIGS. 4-1 and 4-2, taken collectively, illustrate another example of performing physical optimizations on a circuit design for a partial reconfiguration design flow.

FIGS. 5-1, 5-2, and 5-3, taken collectively, illustrate another example of performing physical optimizations on a circuit design for a partial reconfiguration design flow.

DETAILED DESCRIPTION

Figure 1:
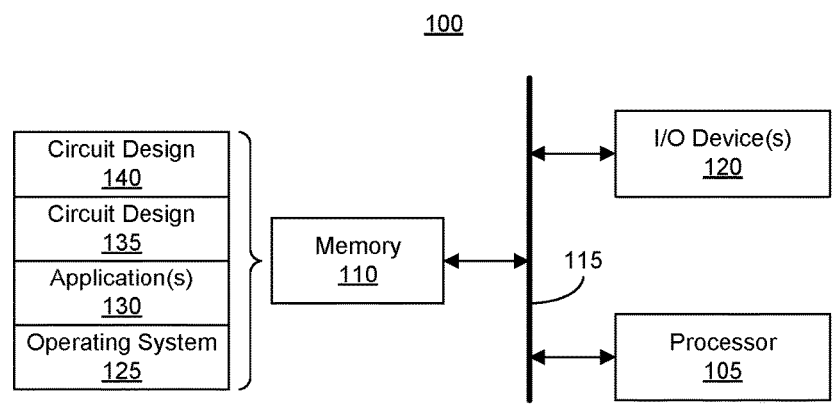
FIG. 1 illustrates an example of a data processing system for use with one or more embodiments described herein.

While the disclosure concludes with claims defining novel features, it is believed that the various features described within this disclosure will be better understood from a consideration of the description in conjunction with the drawings. The process(es), machine(s), manufacture(s) and any variations thereof described herein are provided for purposes of illustration. Specific structural and functional details described within this disclosure are not to be interpreted as limiting, but merely as a basis for the claims and as a representative basis for teaching one skilled in the art to variously employ the features described in virtually any appropriately detailed structure. Further, the terms and phrases used within this disclosure are not intended to be limiting, but rather to provide an understandable description of the features described.

This disclosure relates to integrated circuits (ICs) and, more particularly, to performing logical and/or physical optimizations in a partial reconfiguration design flow for an integrated circuit (IC). As discussed, partial reconfiguration refers to the dynamic modification of circuitry in an IC while other circuitry continues to operate uninterrupted. The portion of the circuit design that specifies the circuitry to be dynamically updated is referred to as the reconfigurable module (also known as an "RM"). A "reconfigurable module" or "RM" refers to a portion of the circuit design (e.g., a structural netlist or HDL description) that is physically implemented when instantiated within an IC. Multiple, different RMs may be implemented in a single reconfigurable partition within the IC.

The circuitry within a reconfigurable partition of the IC may be repeatedly changed or updated by swapping different reconfigurable modules in and out of the reconfigurable partition over time during operation of the IC. Each different reconfigurable module that is implemented within the IC may perform a different function. Further, each different reconfigurable module, once instantiated, communicates with the surrounding static circuitry via the same physical interface. As such, the functionality of the interface between a reconfigurable module and the surrounding static circuitry is preserved. Due to the importance of preserving the integrity of these interfaces, conventional electronic design automation (EDA) systems refrain from performing logical and/or physical optimizations on any part of the circuit design during partial reconfiguration design flows. As a result, the Quality of Results (QOR) achieved from partial reconfiguration design flows are generally lower than the QOR achieved for default design flows (e.g., non-partial reconfiguration design flows).

One or more embodiments described within this disclosure are directed to using logical and/or physical optimizations for a partial reconfiguration design flow. In an aspect, a system is capable of applying one or more logical and/or physical optimizations to a circuit design during a partial reconfiguration design flow. The system is capable of applying the optimizations in a way that preserves the functionality and integrity of the interface(s) between the static circuitry and the reconfigurable module(s) within the IC. As such, the QOR achieved from a partial reconfiguration design flow is increased.

Further aspects of the inventive arrangements are described below in greater detail with reference to the figures. For purposes of simplicity and clarity of illustration, elements shown in the figures have not necessarily been drawn to scale. For example, the dimensions of some of the elements may be exaggerated relative to other elements for clarity. Further, where considered appropriate, reference numbers are repeated among the figures to indicate corresponding, analogous, or like features.

FIG. 1 illustrates an example of a data processing system (system) 100 for use with one or more embodiments described herein. System 100 includes at least one processor 105, e.g., a central processing unit (CPU). Processor 105 is coupled to memory 110 through interface circuitry 115. System 100 stores computer readable instructions (also referred to as "program code") within memory 110. Memory 110 may be considered an example of computer readable storage media. Processor 105 executes the program code accessed from memory 110 via interface circuitry 115. In an aspect, system 100 is implemented as a computer or other system or device that is suitable for storing and/or executing program code.

Memory 110 includes one or more physical memory devices such as, for example, a local memory and one or more bulk storage devices. The term "local memory" refers to random access memory (RAM) or other non-persistent memory device(s) generally used during actual execution of the program code. The term "bulk storage device" refers to persistent data storage devices. Examples of persistent storage devices include a hard disk drive (HDD) and solid state drive (SSD). System 100 may also include one or more cache memories (not shown) that provide temporary storage of at least some program code to reduce the number of times program code must be retrieved from a bulk storage device during execution.

Examples of interface circuitry 115 include, but are not limited to, an input/output (I/O) subsystem, an I/O interface, a bus system, and a memory interface. For example, interface circuitry 115 may be one or more of any of several types of bus structures, including a memory bus or memory controller, a peripheral bus, an accelerated graphics port, and a processor or local bus using any of a variety of bus architectures. By way of example, and not limitation, such bus architectures include Industry Standard Architecture (ISA) bus, Micro Channel Architecture (MCA) bus, Enhanced ISA (EISA) bus, Video Electronics Standards Association (VESA) local bus, and Peripheral Component Interconnect (PCI) bus.

System 100 further may include one or more input/output (I/O) devices 120 coupled to interface circuitry 115. I/O devices 120 may be coupled to system 100, e.g., interface circuitry 115, either directly or through intervening I/O controllers. Examples of I/O devices 120 include, but are not limited to, a keyboard, a display device, a pointing device, one or more communication ports, and a network adapter. A network adapter refers to circuitry that enables system 100 to become coupled to other systems, computer systems, remote printers, and/or remote storage devices through intervening private or public networks. Modems, cable modems, Ethernet cards, and wireless transceivers are examples of different types of network adapters that may be used with system 100.

Memory 110 stores one or more program modules. The program modules may generally include routines, programs, objects, components, logic, and other suitable data structures. For purposes of illustration, memory 110 stores an operating system 125, one or more application(s) 130, and a circuit design 135. In one or more embodiments, application(s) 130 include an EDA application. The EDA application is capable of performing a partial reconfiguration design flow on circuit design 135 as described herein.

In an aspect, operating system 125 and application(s) 130, being implemented in the form of executable program code, are executed by system 100 and, more particularly, by processor 105, to perform the operations described within this disclosure. As such, operating system 125 and application(s) 130 may be considered an integrated part of system 100. Further, it should be appreciated that any data used, generated, and/or operated upon by system 100 (e.g., processor 105) are functional data structures that impart functionality when employed as part of the system.

System 100 may include fewer components than shown or additional components not illustrated in FIG. 1 depending upon the particular type of device and/or system that is implemented. In addition, the particular operating system and/or application(s) included may vary according to device and/or system type as may the types of I/O devices included. Further, one or more of the illustrative components may be incorporated into, or otherwise form a portion of, another component. For example, a processor may include at least some memory.

System 100 is capable of operating on circuit design 135. Circuit design 135 is a programmatic description of circuitry to be implemented within an IC. The IC may be programmable IC such as a field programmable gate array (FPGA). Circuit design 135 is implemented as a data structure stored in memory 110. Circuit design 135 may be specified using a hardware description language (HDL), as a netlist, or in another suitable format. Circuit design 135 includes one or more reconfigurable modules.

System 100 is capable of operating on circuit design 135 and applying one or more optimizations at one or more different times during the partial reconfiguration design flow. The partial reconfiguration design flow includes multiple stages such as synthesis, place, and/or route. The optimizations performed by system 100 may be logical optimizations and/or physical optimizations.

An "optimization," as used within this disclosure, refers to one or more operations performed by a processor or data processing system that modify a circuit design to improve the QOR achieved when the circuit design is implemented within an IC. Examples of improving the QOR for a circuit design include, but are not limited to, improving timing (e.g., making the circuit faster), implementing the circuit design using fewer resources or circuit components of the IC, and implementing the circuit design to consume less power.

A logical optimization refers to a change to the netlist of a circuit design. A logical optimization further refers to a change to the netlist that does not change physical location information for circuit elements. Logical optimizations may be performed by system 100 as part of a synthesis phase of a partial reconfiguration design flow and/or following the synthesis phase of a partial reconfiguration design flow. In the examples noted, the netlist does not include physical location information at this stage of implementation. Accordingly, the optimizations may be referred to as logical optimizations. In general, system 100 is capable of applying or performing logical optimizations to circuitry of circuit design 135 that is entirely external to reconfigurable module(s) and to circuitry of circuit design 135 that is entirely within reconfigurable module(s) without modification of the respective logical optimization that is applied. System 100 does not perform logical optimizations across boundaries, e.g., interfaces, between circuitry external to the reconfigurable module and circuitry within the reconfigurable module to avoid any changes to the logic functionality of the interface(s). Similarly, system 100 does not perform logical optimizations to instances connected to interfaces between static circuitry and circuitry within the reconfigurable module within circuit design 135.

A physical optimization refers to techniques that make changes in the physical location information of a circuit design. Physical location information refers to information that specifies location of circuit elements such as pins, nets, and wires. A physical optimization may be performed by a system following placement, following routing, or both when physical location information for circuit elements is generated and specified within circuit design (e.g., netlist or other suitable circuit representation). System 100 is capable of applying or performing one or more physical optimizations belonging to a first group of physical optimizations to static circuitry, reconfigurable module(s), and interface(s) between the static circuitry and the reconfigurable module(s) of circuit design 135. System 100 is capable of applying or performing one or more physical optimizations belonging to a second group of physical optimizations on static circuitry, reconfigurable module(s), and interface(s) between the static circuitry and the reconfigurable module(s) of circuit design 135 by enhancing the physical optimizations. System 100 is also capable of performing one or more other physical optimizations belong to a third group of physical optimizations to circuitry entirely external to the reconfigurable module(s) and to circuitry entirely within the reconfigurable module(s) of circuit design 135 while excluding or not processing the interface(s) between the static circuitry and the reconfigurable module(s) or any instances connected to the interfaces within circuit design 135.

Having performed one or more optimizations on circuit design 135 as described herein, system 100 is capable of generating and outputting circuit design 140 to another device and/or system such as memory 110 in this example. Circuit design 140 is functionally equivalent to circuit design 135. Circuit design 140, however, has undergone one or more stages of a partial reconfiguration design flow and undergone one or more optimizations as described in greater detail below. Partial bitstreams may be generated from circuit design 140, or portions thereof, and implemented within a programmable IC.

FIGS. 2-6 illustrate examples of performing optimizations on a circuit design during a partial reconfiguration design flow. The optimizations may be performed by a system such as system 100 described in connection with FIG. 1. For purposes of illustration, the various portions of circuitry shown in FIGS. 2-6, e.g., static circuitry and circuitry within a reconfigurable module, are implemented as programmable circuitry. In an embodiment, the IC in which the circuit designs are implemented is a field programmable gate array (FPGA).

Programmable circuitry may include different types of programmable circuit elements such as flip-flops, latches, and other circuit blocks. Examples of circuit blocks include, but are not limited to, lookup tables (LUTs), block random access memories (block RAMs), digital signal processing blocks (DSP blocks), configurable logic blocks (CLBs), and shift register logic (SRL) blocks.

Figure 2:
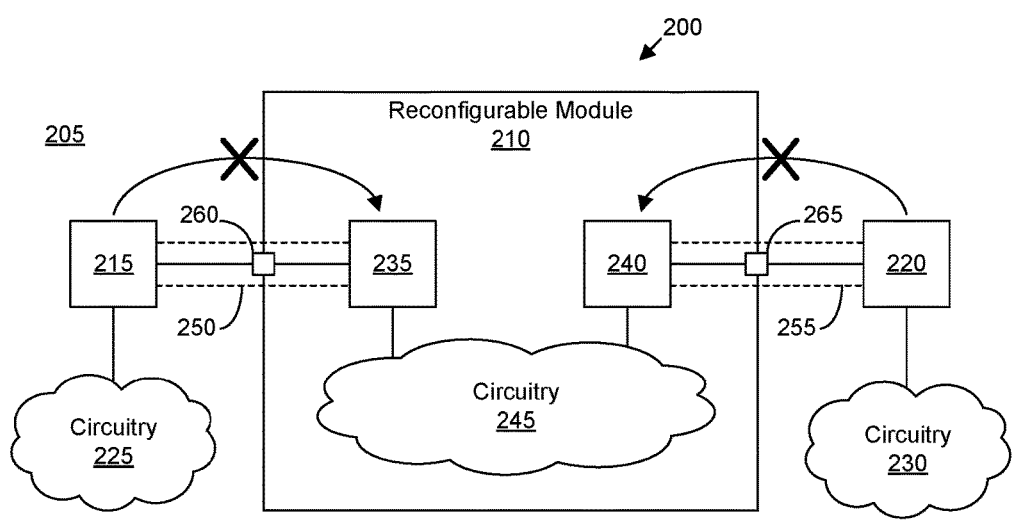
FIG. 2 illustrates an example of performing logical optimizations on a circuit design for a partial reconfiguration design flow.

FIG. 2 illustrates an example of performing logical optimizations on a circuit design for a partial reconfiguration design flow. As pictured, a circuit design 200 includes static circuitry 205 and a reconfigurable module 210. Static circuitry is circuitry that is not part of a reconfigurable module. Static circuitry 205 includes one or more circuit blocks. For purposes of illustration, static circuitry 205 includes circuit block 215, circuit block 220, circuitry 225, and circuitry 230. Reconfigurable module 210 includes one or more circuit blocks. For purposes of illustration, reconfigurable module 210 includes circuit block 235, circuit block 240, and circuitry 245.

In implementing partial reconfiguration within an IC, reconfigurable module 210 may be replaced with a different reconfigurable module of circuit design 200. Thus, different reconfigurable modules may be instantiated in an IC and replaced with other, different reconfigurable modules over time during operation of the IC. During partial reconfiguration, as reconfigurable modules are replaced, static circuitry 205 remains unchanged. Circuit block 215, circuit block 220, circuitry 225, and circuitry 230 remain unchanged (e.g., intact) and operational. To support partial reconfiguration, the functionality of the interface between static circuitry 205 and reconfigurable module 210, and each other reconfigurable module, must remain functionally unchanged.

In the example of FIG. 2, the interfaces between static circuitry 205 and reconfigurable module 210 are implemented as net 250 and net 255, respectively. Reconfigurable module 210 is coupled to static circuitry 205 via net 250 on the input side. Net 250 couples circuit block 215 with circuit block 235. Net 250 includes a partition pin 260. A partition pin represents a logical and physical connection between static circuitry and circuitry that is within a reconfigurable module. Reconfigurable module 210 is also coupled to static circuitry 205 via net 255. Net 255 couples circuit block 240 with circuit block 220. Net 255 further includes a partition pin 265. The boundary between static circuitry 205 and reconfigurable module 210 is defined by partition pins 260 and 265. Nets 250 and 255 are "interface nets" in that each net connects a circuit block (or instance) in static circuitry 205 to circuitry inside of reconfigurable module 210.

In an embodiment, the system is capable of performing logical optimizations of circuit design 200 on static circuitry 205 that is entirely outside of, or external to, reconfigurable module 210 and on circuitry that is entirely inside of, or internal to, reconfigurable module 210. For example, the system performs logical optimizations on circuitry 225, on circuitry 230, and on circuitry 245. The system does not perform logical optimizations on the boundary between static circuitry 205 and reconfigurable module 210. More particularly, the system does not perform logical optimizations on nets that connect static circuitry 205 with circuitry inside of reconfigurable module 210. Similarly, the system does not perform logical optimizations on instances connected to such nets. For purposes of this disclosure, a circuit block (or instance) within static circuitry that is connected to an interface net is not considered to be "entirely external" or "entirely outside" of a reconfigurable module. Similarly, a circuit block (or instance) within a reconfigurable module that is connected to an interface net is not considered to be "entirely within" or "entirely inside" of the reconfigurable module. Thus, referring to FIG. 2, the system does not perform logical optimizations on net 250, net 255, or on circuit blocks 215, 220, 235, or 240.

In an embodiment, the system is capable of determining that net 250 is coupled to a pin of circuit block 215 in static circuitry 205 and drives circuit block 235 within reconfigurable module 210. Similarly, the system is capable of determining that net 255 is coupled to a pin of circuit block 240 within reconfigurable module 210 and drives circuit block 220 in static circuitry 205. As such, the system is capable of performing logical optimizations on circuitry 225, stopping at circuit block 215 (e.g., skipping circuit block 215, net 250, and circuit block 235), continuing to perform logical optimizations on circuitry 245, stopping at circuit block 240 (e.g., skipping circuit block 240, net 255, and circuit block 220), and performing logical optimizations on circuitry 230.

The system does not perform logical optimizations on the boundaries between static circuitry 205 and reconfigurable module 210. In other words, the system does not perform logical optimizations that would cross a partition pin. The system excludes circuit blocks 215, 220, 235, and 240 and nets 250 and 255 from logical optimization processing. In effect, the system performs logical optimizations on static circuitry 205 that does not interact with circuitry within reconfigurable module 210 and performs logical optimizations on circuitry of reconfigurable module 210 that does not interact with static circuitry 205.

As an example, consider the case where circuit blocks 215, 220, 235, and 240 are LUTs. The LUTs may not be combined in a way that would cross the boundary between static circuitry 205 and reconfigurable module 210. As such, circuit block 215 may not be moved beyond partition pin 260 inside of reconfigurable module 210 and combined with circuit block 235. Similarly, circuit block 240 may not be moved beyond partition pin 265 outside of reconfigurable module 210 and combined with circuit block 220. Such logical optimizations, if performed on the interfaces, would modify the logical functionality of the interfaces to reconfigurable module 210 thereby rendering the interfaces unusable for different reconfigurable modules implemented in place of reconfigurable module 210.

FIG. 2 is provided for purposes of illustration and is not intended to limit the embodiments described within this disclosure. Examples of logical optimizations that may be performed by system 100 as described herein include, but are not limited to, constant propagation, sweep, buffer optimization, module based replication, and control set collapse.

Constant propagation refers to the dissolution of sections of HDL or a netlist into constants. For example, the system may perform Boolean optimization resulting in constant propagation. The system is capable of propagating constants where needed, e.g., to other instances, to reduce gate count and area usage when implementing the circuit design. Sweep refers to the removal of circuitry. The system is capable of identifying circuitry that is not driving any other instance and removing such circuitry from circuit design 200.

Buffer optimization refers to the insertion of buffers based upon the number of loads of certain nets. For example, the system is able to determine nets that drive set, reset, and clock enable pins of sequential circuit blocks. For those nets that have a number of loads exceeding a threshold number of loads, the system is capable of inserting one or more additional buffers to drive the loads.

Module based replication refers to identifying nets that have more than a threshold number of loads and replicating the original driver of the loads to perform load balancing. The system is capable of performing load balancing on a per module basis. For example, the system is capable of replicating a driver so that all loads of each different module for a given net are driven by a same driver. The system is capable of replicating the original driver so that each module with loads of the net has a driver that drives each load of the module.

Control set collapse refers to identifying sequential circuit elements that have the same control set and collapsing, or combining, the drivers. The term "control set" means two or more control pins of two or more different circuit components that are of a same control pin type and are driven by a same control signal or a same instance of a driver circuit component. A control set can be a unique set of control and/or clock nets for sequential circuit components such as flip-flops, latches, block RAMs, and so forth. Two circuit components are in a same control set when each of the two circuit components has a same control pin type (e.g., set, reset, clock enable, clear) that is driven by a same signal and/or a same driver circuit component (e.g., different instances of a same circuit component). The system is capable of identifying circuit elements of the same control set and collapsing the drivers of such signals to reduce the number of circuit elements used in the circuit design.

Figure 3:
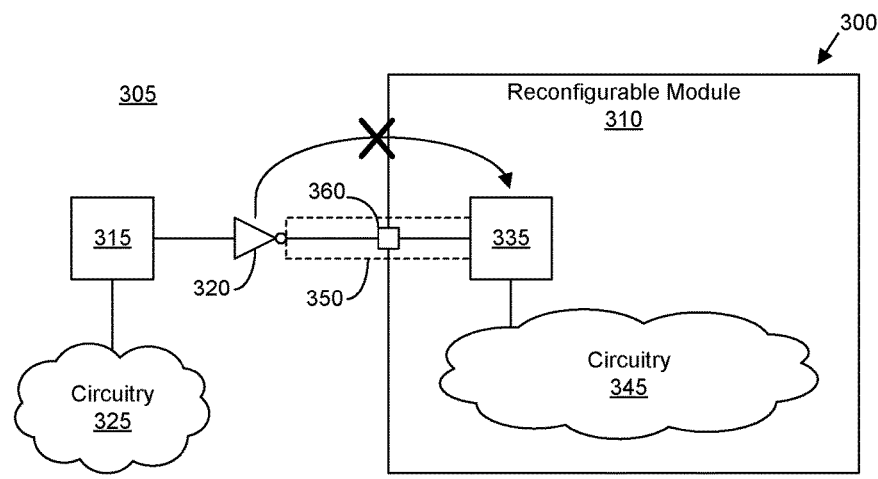
FIG. 3 illustrates an example of performing physical optimizations on a circuit design for a partial reconfiguration design flow.

FIG. 3 illustrates an example of performing physical optimizations on a circuit design for a partial reconfiguration design flow. In an embodiment, the system is capable of assigning physical optimizations to one of three different groups based upon whether the physical optimization can be applied to interface nets and/or whether the physical optimization requires enhancement.

Referring to FIG. 3, circuit design 300 includes static circuitry 305 and a reconfigurable module 310. Static circuitry 305 includes circuit block 315, inverter 320, and circuitry 325. Reconfigurable module 310 includes circuit block 335 and circuitry 345. In the example of FIG. 3, the interface between static circuitry 305 and reconfigurable module 310 is implemented as net 350. Reconfigurable module 310 is coupled to static circuitry 305 via net 350. Net 350 couples inverter 320 with circuit block 335. Net 350 includes a partition pin 360. Net 350 is an interface net.

The first group of physical optimizations may be applied to static circuitry 305, reconfigurable module 310, and to the interface between static circuitry 305 and reconfigurable module 310. Further, the physical optimizations of the first group do not require any enhancement. Examples of physical optimizations belonging to the first group include, but are not limited to, replace, reroute, and pin-swapping. The system is capable of applying these physical optimizations without modifying or enhancing the physical optimizations. The system is capable of applying the physical optimizations of the first group to interfaces without changing the functionality of the interface.

Replacing refers to the system discarding the placement for the circuit blocks, including interface circuit blocks, and replacing the circuit blocks. Reroute refers to the system discarding the routing of the of nets, including the interface net(s), and rerouting the interface net(s). Pin-swapping refers to the system assigning a particular signal to a different input pin of a circuit block. A circuit block such as circuit block 335 may have multiple input pins. Often, these different input pins have different timing characteristics due to varying implementations so that each pin of the circuit block has a different, or slightly different delay. Routing, as performed by the system, is capable of coupling a signal to a particular circuit block without specifying a particular pin of the circuit block that the signal is to connect. In this regard, the system is capable of changing the particular pin to which a signal connects without changing the routing or the logic functionality of the interface. Pin-swapping is considered a structural netlist optimization since the internal configuration of a circuit block, e.g., pin assignments to signals, is modified as opposed to routing. In some cases, pin-swapping is referred to as signal reordering.

The second group of physical optimizations may be applied to static circuitry 305, to reconfigurable module 310, and to the interface between static circuitry 305 and reconfigurable module 310, but with enhancements as described herein. Examples of physical optimizations belonging to the second group include, but are not limited to, fanout optimization, replication, and DSP/block RAM/SRL optimizations. Fanout optimization refers to creating copies of drivers of high fanout nets to reduce fanout. Replication is similar to fanout optimization but may be performed for lower fanout nets. DSP/block RAM/SRL optimizations refer to moving a flip-flop out from a DSP, block RAM, or SRL circuit block so that the flip-flop is implemented elsewhere in the circuit design or to moving a flip-flop that is outside of one of the enumerated circuit blocks back into the circuit block.

The third group of physical optimizations may be applied only to portions of static circuitry 305 entirely external to reconfigurable module 310 and to portions of circuitry entirely within reconfigurable module 310, where interface nets and circuit blocks driving or driven by interface nets are excluded. For example, physical optimizations in the third group may be applied in the same manner as logical optimizations.

Examples of physical optimizations that are members of the third group that the system does not apply to interfaces between static circuitry 305 and reconfigurable module 310 include, but are not limited to, rewire and restructure operations. In general, a rewire type of physical optimization is where the system moves a critical (e.g., timing critical) signal toward (e.g., closer) to the fanout of a logic cone or toward the fanin of a logic cone. A restructure type of physical optimization is where the system combines a plurality of LUTs (or circuit elements) into one large Boolean logic circuit structure and then rebuilds the circuit structure using different LUTs with different logical structures.

FIG. 3 illustrates an example of a physical optimization belonging to the third group that is not performed on the boundary between static circuitry 305 and reconfigurable module 310. Accordingly, the system is capable of performing the physical optimization on static circuitry 305 that is entirely outside of, or external to, reconfigurable module 310 and on circuitry that is entirely inside of, or internal to, reconfigurable module 310. For example, the system performs physical optimizations on circuit block 315 (e.g., circuit block 315 is not directly connected to interface net 350), circuitry 325 and on circuitry 345. In the example of FIG. 3, inverter 320 may not be moved into reconfigurable module 310 and combined with circuit block 335. For example, if circuit block 335 is a LUT, a physical optimization that can be performed in a non-partial reconfiguration design flow is to combine inverter 320 with circuit block 335. In an embodiment, the system refrains from performing such a physical optimization during a partial reconfiguration design flow as doing so would change the functionality of the interface. Net 350, for example, would not specify the inverse of a signal, but rather the signal in a non-inverted state thereby modifying the logic functionality of the interface for each other reconfigurable module that may be implemented.

Figures 1, 2, 4:
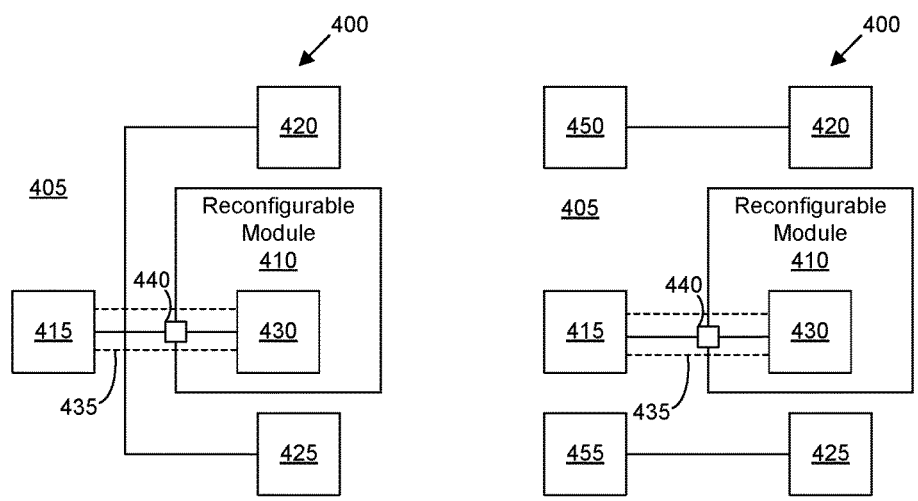

FIGS. 4-1 and 4-2, taken collectively, illustrate another example of performing physical optimizations on a circuit design for a partial reconfiguration design flow. FIGS. 4-1 and 4-2, referred to collectively as FIG. 4, illustrate an example of a physical optimization belonging to the second group that requires some enhancement. In the example of FIG. 4, the physical optimization is replication.

FIG. 4-1 illustrates an initial state of circuit design 400 prior to application of the physical optimization. In FIG. 4-1, circuit design 400 includes static circuitry 405 and reconfigurable module 410. Static circuitry 405 includes circuit block 415, circuit block 420, and circuit block 425. Reconfigurable module 410 includes circuit block 430. Net 435 is an interface net coupling static circuitry 405 to reconfigurable module 410. Net 435 includes partition pin 440. Circuit blocks 420, 425, and 430 are loads of circuit block 415.

FIG. 4-2 illustrates the state of circuit design 400 subsequent to the system performing replication. In the example of FIG. 4-2, the system is capable of decoupling the loads of circuit block 415 that are within static circuitry 405 and decoupling the loads of circuit block 415 that are within reconfigurable module 410. The system is capable of dividing the initial replication problem into multiple sub-problems. In an aspect, loads are grouped based upon inclusion in reconfigurable module 410. For example, circuit blocks 420 and 425, being part of static circuitry 405, are processed as one group (or sub-problem). Circuit block 430, being part of reconfigurable module 410, is processed in another group. In the example of FIG. 4-2, the system is capable of performing replication for the first group, e.g., circuit blocks 420 and 425. The system is capable of performing replication for the second group, e.g., circuit block 430, as part of a separate optimization.

As pictured, the system replicates circuit block 415 to create circuit block 450 and circuit block 455. The system uses circuit block 450 to drive circuit block 420. The system uses circuit block 455 to drive circuit block 425. In one or more embodiments, circuit blocks 420 and 425 may be representative of a plurality of circuit blocks. Circuit block 415 is left to drive circuit block 430. In another example, the system may replicate circuit block 415 by creating only circuit block 450. In that case, the system is capable of driving both of circuit blocks 420 and 425 with circuit block 450 and driving circuit block 430 with circuit block 415. The system, in performing replication for an interface net, is capable of driving loads within static circuitry 405 with one or more drivers and driving loads within reconfigurable module 410 with one or more separate and distinct drivers.

While the example of FIG. 4-2 uses the replicated circuit blocks to drive loads in static circuitry 405, it should be appreciated that the system may use a replicated circuit block to drive the circuit block(s) of reconfigurable module 410 and use the original driver to drive one or more circuit blocks of static circuitry 405. Further, the number of replication operations may be determined based upon the number of loads or other criteria.

Figures 1, 5:
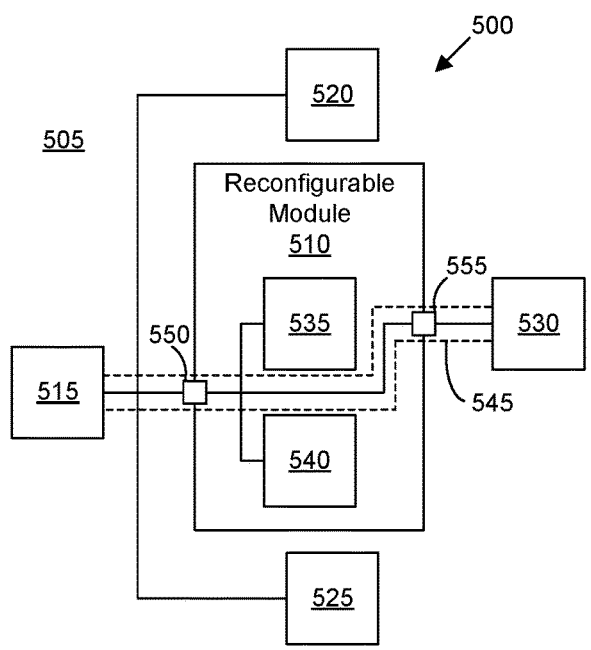
Figures 2, 5:
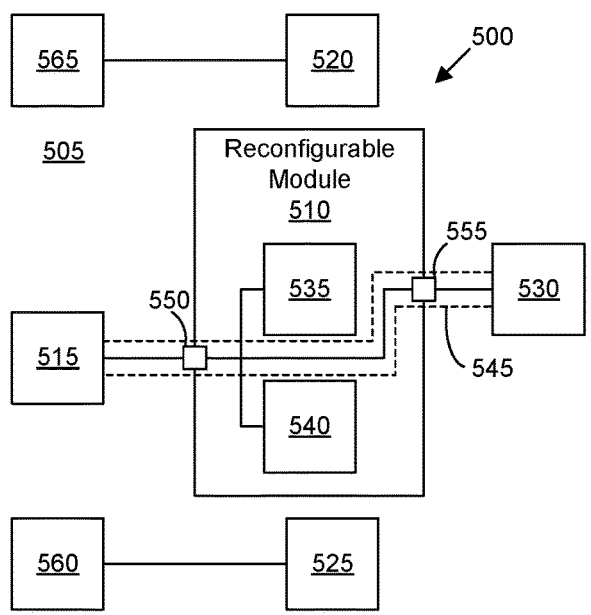
Figures 3, 5:
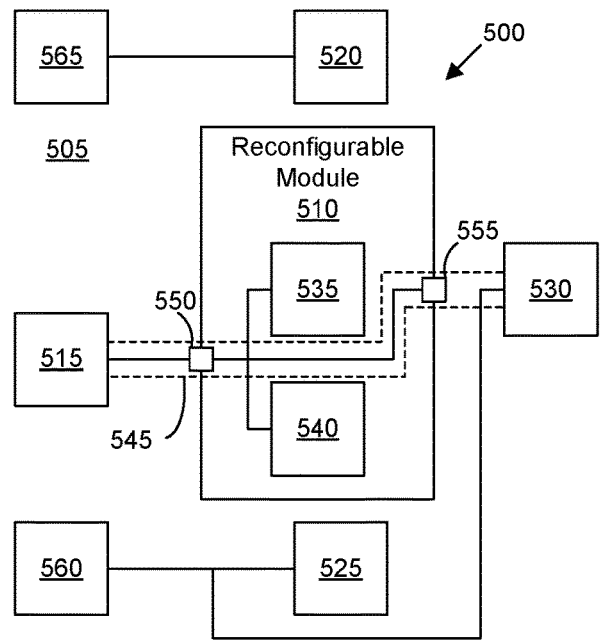

FIGS. 5-1, 5-2, and 5-3, taken collectively, illustrate another example of performing physical optimizations on a circuit design for a partial reconfiguration design flow. FIGS. 5-1, 5-2, and 5-3, referred to collectively as FIG. 5, illustrate an example of a physical optimization belonging to the second group that requires some enhancement. In the example of FIG. 5, the physical optimization is replication.

FIG. 5-1 illustrates an initial state of circuit design 500 prior to application of the physical optimization. In FIG. 5-1, circuit design 500 includes static circuitry 505 and reconfigurable module 510. Static circuitry 505 includes circuit block 515, circuit block 520, circuit block 525, and circuit block 530. Reconfigurable module 510 includes circuit block 535 and circuit block 540. Net 545 is an interface net coupling static circuitry 505 to reconfigurable module 510. Net 545 includes partition pin 550 and partition pin 555.

In the example of FIG. 5-1, circuit blocks 520, 525, 530, 535, and 540 are loads of circuit block 515. As shown, the path between circuit block 515 and circuit block 530 traverses through reconfigurable module 510. In this regard, net 545 has a pass-through portion that passes through reconfigurable module 510 and directly drives circuit block 530. A pass-through net is a net that connects a driver located in static circuitry with a load located in static circuitry. The portion of the pass-through net that drives the load located in static circuitry passes through reconfigurable module 510 without driving any other circuit block within reconfigurable module 510. For example, while net 545 drives circuit blocks 535 and 540, the portion of net 545 that drives circuit block 530 does so directly by traversing, or passing, through reconfigurable module 510 without passing through any intervening circuitry within reconfigurable module 510. As pictured, there are no intervening circuit blocks or elements between circuit block 515 (driver) and circuit block 530 (load).

In an embodiment, the system is capable of identifying each downstream load of partition pin 550. As such, the system is capable of determining that circuit block 530, within static circuitry 505, is a downstream load of partition pin 550. For example, the system determines that circuit block 530 is driven by partition pin 550 directly without any other intervening circuit structures within reconfigurable module 510.

The system is capable of applying a physical optimization to circuit design 500 as illustrated in FIG. 5-2. In an aspect, the system is performs a process the same as, or similar to, the process described in connection with FIGS. 4-1 and 4-2. For example, the system is capable of decoupling the loads of circuit block 515, grouping the loads based, at least in part, upon membership within reconfigurable module 510. The system is capable of performing replication on the groups separately (e.g., performing replication for loads in the static circuitry separately from performing replication for loads in the reconfigurable module). For purposes of grouping, loads that are driven by portion of net 545 that are considered "pass-through," i.e., circuit block 530 in this example, are considered part of the reconfigurable module. As such, the system replicates circuit block 515 to create circuit block 560 and circuit block 565. Circuit block 560 drives circuit block 525. Circuit block 565 drives circuit block 520. Circuit block 515 drives circuit blocks 535, 540, and 530.

In an embodiment, the system is capable of maintaining the pass-through feature of net 545 while performing replication. FIG. 5-2 illustrates that circuit block 530 is still coupled to a circuit block that drives partition pin 550 (whether the original driver or a replicated driver). Thus, circuit block 530 is still driven by partition pin 550. The downstream path from partition pin 550 to circuit block 530 is unbroken from the physical optimization performed by the system in FIG. 5-2. Maintaining the pass-through feature of net 545 is an enhancement performed by the system for replication and/or fanout optimizations.

FIG. 5-3 illustrates an example of an illegal physical optimization operation performed on circuit design 500. In FIG. 5-3, as shown, net 545 no longer drives circuit block 530. The connection between partition pin 555 and the input to circuit block 530, e.g., the pass-through portion of net 545, is severed or broken. Circuit block 530 is driven by a net coupled to an output of circuit block 560. Thus, the pass-through feature of net 545 is not maintained. FIG. 5-3 illustrates an illegal operation since other reconfigurable modules that may be implemented may process the signal that drives circuit block 530. The optimization performed in FIG. 5-3 would bypass such processing thereby changing the logic functionality of the interface between reconfigurable module 510 and circuit block 530.

Figure 6:
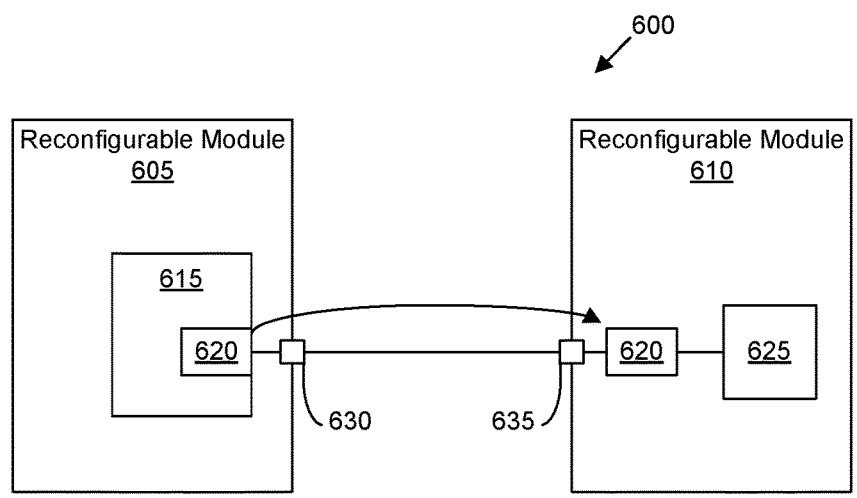
FIG. 6 illustrates another example of performing physical optimizations on a circuit design for a partial reconfiguration design flow.

The replication examples described herein in connection with FIGS. 5 and 6 may be implemented in circuit designs that include one or more reconfigurable modules. For example, the interface net may have a plurality of loads where a first subset of the plurality of loads is located within a first reconfigurable module and a second subset of the plurality of loads is located in static circuitry or in a second reconfigurable module (e.g., a second reconfigurable module implemented in the IC concurrently with the first reconfigurable module). In that case, the system is capable of performing the physical optimization for the first subset of the plurality of loads independently of performing the physical optimization for the second subset of the plurality of loads.

FIG. 6 illustrates another example of performing physical optimizations on a circuit design for a partial reconfiguration design flow. FIG. 6 shows circuit design 600 including reconfigurable module 605 and reconfigurable module 610. Reconfigurable module 610 includes a circuit block 615.

Circuit block 615 may be a more complex circuit block such as a DSP block, a block RAM, or a SRL type of circuit block. As pictured, circuit block 615 includes a circuit element 620. Circuit element 620 may be a flip-flop or a latch.

In an embodiment, the system is capable of modifying circuit design 600 to push circuit element 620 from circuit block 615 and from reconfigurable module 605 into reconfigurable module 610. In pushing circuit element 620 from reconfigurable module 605 to reconfigurable module 610, the system ensures that both reconfigurable module 605 and reconfigurable module 610 are of a same level of hierarchy in the circuit design. If, for example, reconfigurable module 605 and reconfigurable module 610 are of different levels of hierarchy in the circuit design, the system does not pull circuit element 620 from reconfigurable module 605 to reconfigurable module 610. Further, reconfigurable module 605 and reconfigurable module 610 are connected by a net so that no intervening circuitry exists between the location from which circuit element 620 was moved and the location to which circuit element 620 is moved.

In the example of FIG. 6, the system does not move circuit element 620 from a reconfigurable module into static circuitry. In this regard, the system does not move circuit element 620 to a location that is between partition pin 630 and partition pin 635. Rather, circuit element 620 remains within a reconfigurable module. While FIG. 6 describes the physical optimization performed as "moving" circuit element 620, in an embodiment, circuit element 620 may be bypassed and another circuit element (e.g., flip-flop or latch) within reconfigurable module 610 in the signal path activated or turned on.

In another embodiment, the system is capable of operating on an interface net by performing DSP/block RAM/SRL optimization. In an embodiment, the system is capable of pushing a circuit element such as a flip-flop or latch into, or pulling a circuit element such as a flip-flop or latch from, a circuit block such as a DSP block, a block RAM, or an SRL type of circuit block under certain conditions. As discussed, DSP/block RAM/SRL optimization is considered a physical optimization within the second group. The system is capable of ensuring that the pushed or pulled circuit element does not move beyond (e.g., past or crossing) a partition pin of a reconfigurable module.

Referring to FIG. 6, for example, where only reconfigurable module 605 exists in the circuit design, circuit element 620 may be pulled from circuit block 615 so long as circuit element 620 remains within reconfigurable module 605. For example, the system is capable of pulling circuit element 620 from circuit block 615 and locating circuit element 620 between circuit block 615 and partition pin 630 so as not to move circuit element 620 beyond partition pin 630 into static circuitry. Similarly, considering an example where the circuit design includes reconfigurable module 610, but not reconfigurable module 605, and circuit element 620 is located in reconfigurable module 610, the system is capable of pushing circuit element 620 into circuit block 625. Such an optimization does not move circuit element 620 beyond partition pin 635.

In one or more embodiments, the system supports a partial reconfiguration design flow with additional placement related constraints. For example, the system is capable of optimizing instance(s) and/or nets within the reconfigurable module to stay within the reconfigurable module. Similarly, the system optimizes instances and/or nets of the circuit design that are outside of the reconfigurable module by keeping such circuitry outside of the reconfigurable module.

In one or more embodiments, the system supports a partial reconfiguration design flow with additional routing constraints. In response to the additional routing constraints, the system is capable of optimizing and/or creating new routes for instances and/or nets within the reconfigurable module that stay within the reconfigurable module. Further, the system is capable of optimizing and/or creating new routes for instances and/or nets outside of the reconfigurable module that stay outside of the reconfigurable module.

Figure 7:
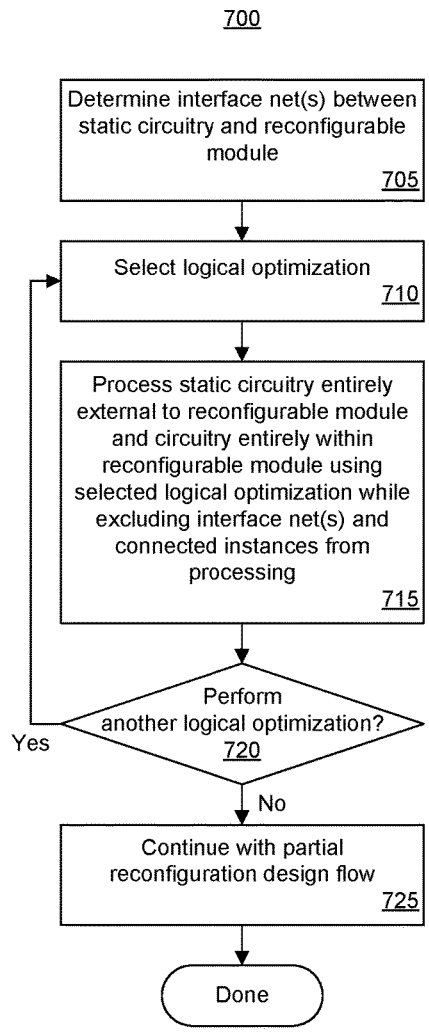
FIG. 7 illustrates an example method of performing logical optimizations for a partial reconfiguration design flow.

FIG. 7 illustrates an example method 700 of performing logical optimizations for a partial reconfiguration design flow. Method 700 is performed by a system as described herein in connection with FIG. 1. Method 700 may begin in a state where a circuit design configured for partial reconfiguration is to undergo a partial reconfiguration design flow.

In block 705, the system determines interface net(s) between the static circuitry and a reconfigurable module of the circuit design. In block 710, the system selects a logical optimization to be performed on the circuit design. The system is capable of performing a plurality of different logical optimizations on the circuit design. Accordingly, in block 710, the system selects one of the plurality of logical optimizations to perform.

In block 715, the system processes the static circuitry of the circuit design that is entirely external to the reconfigurable module and circuitry that is entirely within the reconfigurable module using the selected logical optimization. The system excludes the interface net(s) identified in block 705 and instances (e.g., circuit blocks) connected to the interface nets from processing using the selected logical optimization.

For example, the system processes portions of the static circuitry excluding the interface net(s) and any instances of the static circuitry connected (e.g., directly connected) to an interface net using the selected logical optimization. Further, the system processes portions of circuitry entirely within the reconfigurable module excluding the interface net(s) and any instances of the circuitry within the reconfigurable module that are connected to an interface net.

While FIG. 7 describes processing portions of circuitry in general, in an embodiment, the system is capable of following signal paths through the circuit design and selectively applying the logical optimization to the portions of circuitry along the signal paths as described in connection with FIG. 2. For example, the system may begin applying the logical optimization to circuitry that is allowed to be processed (circuitry entirely external to the reconfigurable module), discontinue processing for circuitry that is disallowed (e.g., interface nets and connected instances) along the signal path, continue processing circuitry that is allowed (e.g., circuitry entirely within the reconfigurable module), and so forth.

In block 720, the system determines whether to perform another logical optimization. In an embodiment, the system determines whether there are additional logical optimizations to perform that have not yet been performed. If so, method 700 loops back to block 710 to continue processing. If not, method 700 continues to block 725.

In another embodiment, the system is capable of continuing to block 725 in response to determining that timing of the circuit design meets a predetermined criterion. Examples of the criterion include, but are not limited to, the timing of the circuit design improving by a predetermined amount or the circuit design no longer including any nets that do not meet a timing requirement. In that case, for example, method 700 may continue from block 720 to block 725 despite the ability to perform one or more additional logical optimizations.

Referring to block 715 and the performance of logical optimizations, the system is capable of applying the logical optimizations at varying points within the partial reconfiguration design flow. In an example, the system is capable of performing the logical optimizations during synthesis. In another example, the system is capable of performing the logical optimizations following synthesis.

In block 725, the system is capable of continuing with the partial reconfiguration design flow. For example, as discussed, the optimizations described in connection with FIG. 7 may be performed during synthesis and/or following synthesis. As such, in block 725, the system is capable of performing operations such as placement on the circuit design, routing on the circuit design, or both.

Figure 8:
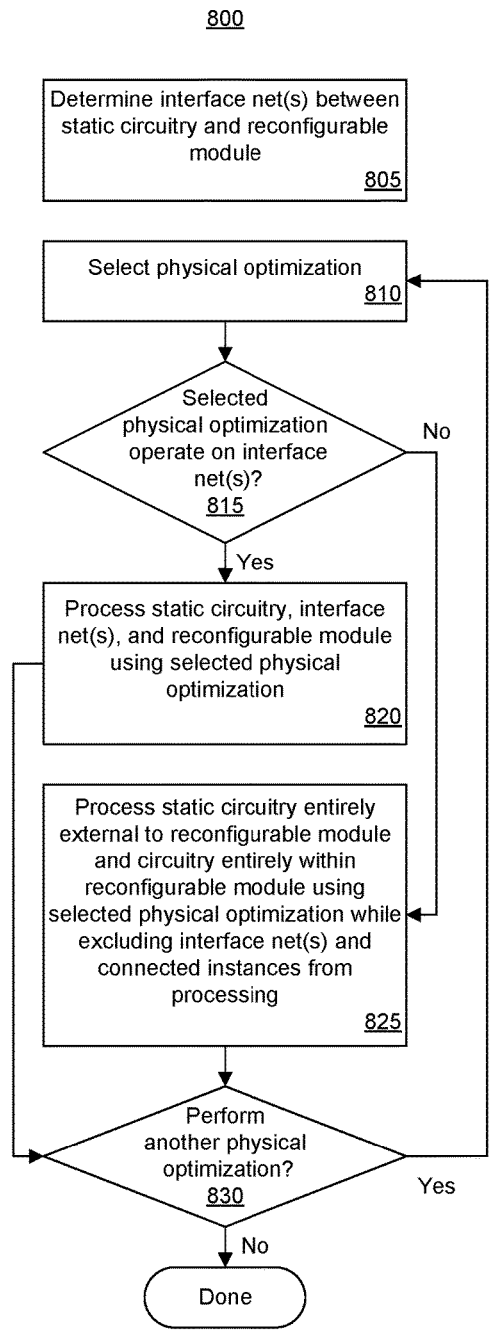
FIG. 8 illustrates an example method of performing physical optimizations for a partial reconfiguration design flow.

FIG. 8 illustrates an example method 800 of performing physical optimizations for a partial reconfiguration design flow. Method 800 is performed by a system as described herein in connection with FIG. 1. Method 800 may begin in a state where a circuit design configured for partial reconfiguration is to undergo a partial reconfiguration design flow.

In block 805, the system determines interface net(s) between the static circuitry and a reconfigurable module of the circuit design. In block 810, the system selects a physical optimization. The system selects a physical optimization from a plurality of physical optimizations. The physical optimizations may be grouped as discussed. Physical optimizations belonging to the first and second groups are able to operate on the interface nets and connected instances. Physical optimizations of the third group are not applied to interface nets and connected instances.

Accordingly, in block 815, the system determines whether the selected physical optimization is permitted to operate on interface net(s) identified in block 805 and connected instances. If so, method 800 continues to block 820. If not, method 800 proceeds to block 825.

In block 820, the system processes the static circuitry, the interface net(s), and the circuitry of the reconfigurable module using the selected physical optimization. The system is capable of performing the selected physical optimization as described herein. For example, if the selected physical optimization is replace, reroute, or pin-swap, the system performs the selected physical optimization without modification for the partial reconfiguration design flow. If the selected physical optimization is fanout optimization, replication, or DPS/block RAM/SRL optimization the system performs the selected physical optimization using the enhancements described herein.

In block 825, the system processes the portions of the static circuitry entirely external to the reconfigurable module and circuitry entirely within the reconfigurable module using the selected physical optimization while excluding interface net(s) and connected instances from processing using the selected physical optimization. For example, physical optimizations such as rewire and restructure may be performed by the system on circuitry that is entirely external to the reconfigurable module or entirely within the reconfigurable module so long as rewire and restructure are not performed on interface net(s) or instances connected to interface net(s).

In block 830, the system determines whether to perform another physical optimization. In an embodiment, the system determines whether there are additional physical optimizations to perform that have not yet been performed. If so, method 800 loops back to block 810 to continue processing. If not, method 800 can end. In another embodiment, the system is capable of ending method 800 in response to determining that timing of the circuit design meets a predetermined criterion as previously described.

Referring to blocks 820 and/or 825 and the performance of physical optimizations, the system is capable of applying the physical optimizations at varying points within the partial reconfiguration design flow. For example, the system is capable of performing placement on the circuit design, then processing the circuit design using one or more or all of the physical optimization techniques. The system may then perform routing and, subsequent to routing the circuit design, again perform one or more or all of the physical optimization techniques. In another example, the system is capable of performing both placement and routing. Following routing, the system is capable of performing one or more or all of the physical optimization techniques.

In one or more embodiments, the system is capable of performing method 700 of FIG. 7 and further performing method 800 of FIG. 8 as part of a partial reconfiguration design flow. In one or more embodiments, the system is capable of performing only method 700 of FIG. 7 or only performing method 800 of FIG. 8 as part of a partial reconfiguration design flow.

For purposes of explanation, specific nomenclature is set forth to provide a thorough understanding of the various inventive concepts disclosed herein. The terminology used herein, however, is for the purpose of describing particular aspects of the inventive arrangements only and is not intended to be limiting.

As defined herein, the singular forms "a," "an," and "the" are intended to include the plural forms as well, unless the context clearly indicates otherwise. As defined herein, the terms "at least one," "one or more," and "and/or," are open-ended expressions that are both conjunctive and disjunctive in operation unless explicitly stated otherwise. For example, each of the expressions "at least one of A, B and C," "at least one of A, B, or C," "one or more of A, B, and C," "one or more of A, B, or C," and "A, B, and/or C" means A alone, B alone, C alone, A and B together, A and C together, B and C together, or A, B and C together.

As defined herein, the term "computer readable storage medium" means a storage medium that contains or stores program code for use by or in connection with an instruction execution system, apparatus, or device. As defined herein, a "computer readable storage medium" is not a transitory, propagating signal per se. A computer readable storage medium may be, but is not limited to, an electronic storage device, a magnetic storage device, an optical storage device, an electromagnetic storage device, a semiconductor storage device, or any suitable combination of the foregoing. Memory elements, as described herein, are examples of a computer readable storage medium. A non-exhaustive list of more specific examples of a computer readable storage medium may include: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing.

As defined herein, the terms "one embodiment," "an embodiment," "one or more embodiments," or similar language mean that a particular feature, structure, or characteristic described in connection with the embodiment is included in at least one embodiment described within this disclosure. Thus, appearances of the phrases "in one embodiment," "in an embodiment," "in one or more embodiments," and similar language throughout this disclosure may, but do not necessarily, all refer to the same embodiment.

As defined herein, the term "processor" means at least one hardware circuit configured to carry out instructions contained in program code. The hardware circuit may be an integrated circuit. Examples of a processor include, but are not limited to, a central processing unit (CPU), an array processor, a vector processor, a digital signal processor (DSP), a field-programmable gate array (FPGA), a programmable logic array (PLA), an application specific integrated circuit (ASIC), programmable logic circuitry, a graphics processing unit (GPU), and a controller.

The terms first, second, etc. may be used herein to describe various elements. These elements should not be limited by these terms, as these terms are only used to distinguish one element from another unless stated otherwise or the context clearly indicates otherwise.

A computer program product may include a computer readable storage medium (or media) having computer readable program instructions thereon for causing a processor to carry out aspects of the inventive arrangements described herein. Within this disclosure, the term "program code" is used interchangeably with the term "computer readable program instructions." Computer readable program instructions described herein may be downloaded to respective computing/processing devices from a computer readable storage medium or to an external computer or external storage device via a network, for example, the Internet, a LAN, a WAN and/or a wireless network. The network may include copper transmission cables, optical transmission fibers, wireless transmission, routers, firewalls, switches, gateway computers and/or edge devices including edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations for the inventive arrangements described herein may be assembler instructions, instruction-set-architecture (ISA) instructions, machine instructions, machine dependent instructions, microcode, firmware instructions, or either source code or object code written in any combination of one or more programming languages, including an object oriented programming language and/or procedural programming languages. Computer readable program instructions may include state-setting data. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a LAN or a WAN, or the connection may be made to an external computer (for example, through the Internet using an Internet Service Provider). In some cases, electronic circuitry including, for example, programmable logic circuitry, an FPGA, or a PLA may execute the computer readable program instructions by utilizing state information of the computer readable program instructions to personalize the electronic circuitry, in order to perform aspects of the inventive arrangements described herein.

Certain aspects of the inventive arrangements are described herein with reference to flowchart illustrations and/or block diagrams of methods, apparatus (systems), and computer program products. It will be understood that each block of the flowchart illustrations and/or block diagrams, and combinations of blocks in the flowchart illustrations and/or block diagrams, may be implemented by computer readable program instructions, e.g., program code.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the operations specified in the flowchart and/or block diagram block or blocks.

The computer readable program instructions may also be loaded onto a computer, other programmable data processing apparatus, or other device to cause a series of operations to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various aspects of the inventive arrangements. In this regard, each block in the flowcharts or block diagrams may represent a module, segment, or portion of instructions, which comprises one or more executable instructions for implementing the specified operations.

In some alternative implementations, the operations noted in the blocks may occur out of the order noted in the figures. For example, two blocks shown in succession may be executed substantially concurrently, or the blocks may sometimes be executed in the reverse order, depending upon the functionality involved. In other examples, blocks may be performed generally in increasing numeric order while in still other examples, one or more blocks may be performed in varying order with the results being stored and utilized in subsequent or other blocks that do not immediately follow. It will also be noted that each block of the block diagrams and/or flowchart illustrations, and combinations of blocks in the block diagrams and/or flowchart illustrations, may be implemented by special purpose hardware-based systems that perform the specified functions or acts or carry out combinations of special purpose hardware and computer instructions.

The corresponding structures, materials, acts, and equivalents of all means or step plus function elements that may be found in the claims below are intended to include any structure, material, or act for performing the function in combination with other claimed elements as specifically claimed.

One or more embodiments are directed to methods for implementing a partial reconfiguration design flow. In one aspect, a method can include determining an interface net connecting static circuitry and a first reconfigurable module of a circuit design, performing, using a processor, a logical optimization on first circuitry of the static circuitry that is entirely external to the first reconfigurable module and on second circuitry entirely within the reconfigurable module, and excluding the interface net from processing using the logical optimization.

In an aspect, the logical optimization may be constant propagation, sweep, and/or buffer optimization.

In another aspect, the method further includes processing the first circuitry, the second circuitry, and the interface net using a physical optimization. The physical optimization may be replace, reroute, and/or pin-swap.

In another aspect, the interface net has a pass-through portion through the first reconfigurable module and the physical optimization leaves the pass-through portion of the interface net unbroken.

In another aspect, the interface net includes a driver and a plurality of loads, wherein a first subset of the plurality of loads is located within the first reconfigurable module and a second subset of the plurality of loads is located in static circuitry or a second reconfigurable module, wherein the physical optimization is applied to the first subset of the plurality of loads independently of the second subset of the plurality of loads.

In another aspect, the interface net crosses a partition pin separating the first circuitry from the second circuitry, wherein the physical optimization pushes a flip-flop or latch into, or pulls the flip-flop or latch from, a selected circuit block connected to the interface net where the flip-flop or latch does not move past the partition pin.

In another aspect, the physical optimization moves a flip-flop or latch from a circuit block in the first reconfigurable module to a second reconfigurable module coupled to the first reconfigurable module, wherein the first and second reconfigurable modules are of a same level of a hierarchy of the circuit design.

In another aspect, the method includes processing the first circuitry and the second circuitry using a physical optimization while excluding the interface net from processing using the physical optimization.

One or more embodiments are directed to systems for implementing a partial reconfiguration design flow. In one aspect, a system includes a memory configured to store program code and a processor coupled to the memory, wherein the processor, in response to executing the program code, is configured to initiate operations for a partial reconfiguration design flow. The operations include determining an interface net connecting static circuitry and a first reconfigurable module of a circuit design, performing a logical optimization on first circuitry of the static circuitry that is entirely external to the first reconfigurable module and on second circuitry entirely within the reconfigurable module, and excluding the interface net from processing using the logical optimization.

In an aspect, the logical optimization may be constant propagation, sweep, and/or buffer optimization.

In another aspect, the method further includes processing the first circuitry, the second circuitry, and the interface net using a physical optimization. The physical optimization may be replace, reroute, and/or pin-swap.

In another aspect, the interface net has a pass-through portion through the first reconfigurable module and the physical optimization leaves the pass-through portion of the interface net unbroken.

In another aspect, the interface net includes a driver and a plurality of loads, wherein a first subset of the plurality of loads is located within the first reconfigurable module and a second subset of the plurality of loads is located in static circuitry or a second reconfigurable module, wherein the physical optimization is applied to the first subset of the plurality of loads independently of the second subset of the plurality of loads.

In another aspect, the interface net crosses a partition pin separating the first circuitry from the second circuitry, wherein the physical optimization pushes a flip-flop or latch into, or pulls the flip-flop or latch from, a selected circuit block connected to the interface net where the flip-flop or latch does not move past the partition pin.

In another aspect, the physical optimization moves a flip-flop or latch from a circuit block in the first reconfigurable module to a second reconfigurable module coupled to the first reconfigurable module, wherein the first and second reconfigurable modules are of a same level of a hierarchy of the circuit design.

In another aspect, the operations include processing the first circuitry and the second circuitry using a physical optimization while excluding the interface net from processing using the physical optimization.

One or more embodiments are directed to computer program products for implementing a partial reconfiguration design flow. In one aspect, a computer program product includes a computer readable storage medium having program code stored thereon. The program code is executable by a processor to perform operations including determining an interface net connecting static circuitry and a first reconfigurable module of a circuit design, performing a logical optimization on first circuitry of the static circuitry that is entirely external to the first reconfigurable module and on second circuitry entirely within the reconfigurable module, and excluding the interface net from processing using the logical optimization.

In an aspect, the logical optimization may be constant propagation, sweep, and/or buffer optimization.

In another aspect, the method further includes processing the first circuitry, the second circuitry, and the interface net using a physical optimization. The physical optimization may be replace, reroute, and/or pin-swap.

In another aspect, the interface net has a pass-through portion through the first reconfigurable module and the physical optimization leaves the pass-through portion of the interface net unbroken.

In another aspect, the interface net includes a driver and a plurality of loads, wherein a first subset of the plurality of loads is located within the first reconfigurable module and a second subset of the plurality of loads is located in static circuitry or a second reconfigurable module, wherein the physical optimization is applied to the first subset of the plurality of loads independently of the second subset of the plurality of loads.

In another aspect, the interface net crosses a partition pin separating the first circuitry from the second circuitry, wherein the physical optimization pushes a flip-flop or latch into, or pulls the flip-flop or latch from, a selected circuit block connected to the interface net where the flip-flop or latch does not move past the partition pin.

In another aspect, the physical optimization moves a flip-flop or latch from a circuit block in the first reconfigurable module to a second reconfigurable module coupled to the first reconfigurable module, wherein the first and second reconfigurable modules are of a same level of a hierarchy of the circuit design.

In another aspect, the operations include processing the first circuitry and the second circuitry using a physical optimization while excluding the interface net from processing using the physical optimization.

The description of the inventive arrangements provided herein is for purposes of illustration and is not intended to be exhaustive or limited to the form and examples disclosed. The terminology used herein was chosen to explain the principles of the inventive arrangements, the practical application or technical improvement over technologies found in the marketplace, and/or to enable others of ordinary skill in the art to understand the inventive arrangements disclosed herein. Modifications and variations may be apparent to those of ordinary skill in the art without departing from the scope and spirit of the described inventive arrangements. Accordingly, reference should be made to the following claims, rather than to the foregoing disclosure, as indicating the scope of such features and implementations.

What is claimed is:

1. A method of implementing a partial reconfiguration design flow, comprising:
    determining an interface net connecting static circuitry and a first reconfigurable module of a circuit design;
    performing, using a processor, a logical optimization on first circuitry of the static circuitry that is entirely external to the first reconfigurable module and on second circuitry entirely within the reconfigurable module; and
    excluding the interface net from processing using the logical optimization.

2. The method of claim 1, wherein the logical optimization is selected from the group consisting of constant propagation, sweep, and buffer optimization.

3. The method of claim 1, further comprising:
    processing the first circuitry, the second circuitry, and the interface net using a physical optimization.

4. The method of claim 3, wherein the physical optimization is selected from the group consisting of replace, reroute, and pin-swap.

5. The method of claim 3, wherein the interface net has a pass-through portion that connects a driver located in static circuitry with a load also located in static circuitry and passes through the first reconfigurable module, wherein the physical optimization leaves the pass-through portion of the interface net unbroken.

6. The method of claim 3, wherein the interface net includes a driver and a plurality of loads, wherein a first subset of the plurality of loads is located within the first reconfigurable module and a second subset of the plurality of loads is located in static circuitry or a second reconfigurable module, wherein the physical optimization is applied to the first subset of the plurality of loads independently of the second subset of the plurality of loads.

7. The method of claim 3, wherein the interface net crosses a partition pin separating the first circuitry from the second circuitry, wherein the physical optimization pushes a flip-flop or latch into, or pulls the flip-flop or latch from, a selected circuit block connected to the interface net where the flip-flop or latch does not move past the partition pin.

8. The method of claim 3, wherein the physical optimization moves a flip-flop or latch from a circuit block in the first reconfigurable module to a second reconfigurable module coupled to the first reconfigurable module, wherein the first and second reconfigurable modules are of a same level of a hierarchy of the circuit design.

9. The method of claim 1, further comprising:
    processing the first circuitry and the second circuitry using a physical optimization while excluding the interface net from processing using the physical optimization.

10. A system, comprising:
    a memory configured to store program code; and
    a processor coupled to the memory, wherein the processor, in response to executing the program code, is configured to initiate operations for a partial reconfiguration design flow including:
    determining an interface net connecting static circuitry and a first reconfigurable module of a circuit design;
    performing a logical optimization on first circuitry of the static circuitry that is entirely external to the first reconfigurable module and on second circuitry entirely within the reconfigurable module; and
    excluding the interface net from processing using the logical optimization.

11. The system of claim 10, wherein the logical optimization is selected from the group consisting of constant propagation, sweep, and buffer optimization.

12. The system of claim 10, wherein the processor is configured to initiate operations further including:
    processing the first circuitry, the second circuitry, and the interface net using a physical optimization.

13. The system of claim 12, wherein the physical optimization is selected from the group consisting of replace, reroute, and pin-swap.

14. The system of claim 12, wherein the interface net has a pass-through portion that connects a driver located in static circuitry with a load also located in static circuitry and passes through the first reconfigurable module, wherein the physical optimization leaves the pass-through portion of the interface net unbroken.

15. The system of claim 12, wherein the interface net includes a driver and a plurality of loads, wherein a first subset of the plurality of loads is located within the first reconfigurable module and a second subset of the plurality of loads is located in static circuitry or a second reconfigurable module, wherein the physical optimization is applied to the first subset of the plurality of loads independently of the second subset of the plurality of loads.

16. The system of claim 12, wherein the interface net crosses a partition pin separating the first circuitry from the second circuitry, wherein the physical optimization pushes a flip-flop or latch into, or pulls the flip-flop or latch from, a selected circuit block connected to the interface net where the flip-flop or latch does not move past the partition pin.

17. The system of claim 12, wherein the physical optimization moves a flip-flop or latch from a circuit block in the first reconfigurable module to a second reconfigurable module coupled to the first reconfigurable module, wherein the first and second reconfigurable modules are of a same level of a hierarchy of the circuit design.

18. The system of claim 10, wherein the processor is configured to initiate operations further including:
    processing the first circuitry and the second circuitry using a physical optimization while excluding the interface net from processing using the physical optimization.

19. A computer program product comprising a computer readable storage medium having program code stored thereon, the program code executable by a processor to perform operations for a partial reconfiguration design flow comprising:
    determining an interface net connecting static circuitry and a first reconfigurable module of a circuit design;
    performing a logical optimization on first circuitry of the static circuitry that is entirely external to the first reconfigurable module and on second circuitry entirely within the reconfigurable module; and excluding the interface net from processing using the logical optimization.

20. The computer program product of claim 19, wherein the circuit design, subsequent to the performing and the excluding, is configured for implementation within an integrated circuit.

* * * * *